(12) United States Patent
Chen et al.

(10) Patent No.: US 6,649,507 B1
(45) Date of Patent: Nov. 18, 2003

(54) DUAL LAYER PHOTORESIST METHOD FOR FABRICATING A MUSHROOM BUMPING PLATING STRUCTURE

(75) Inventors: Yen-Ming Chen, Hsinchu (TW); Cheng-Yu Chu, Hsinchu (TW); Kuo-Wei Lin, Hsinchu (TW); Chiou-Shian Peng, Hsinchu (TW); Yang-Tung Fan, Jubei (TW); Fu-Jier Fan, Jubei (KR); Shih-Jane Lin, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 38 days.

(21) Appl. No.: 09/883,163

(22) Filed: Jun. 18, 2001

(51) Int. Cl.$^7$ ................................................ H01L 21/44
(52) U.S. Cl. ...................... 438/614; 438/612; 438/613; 438/717; 438/736
(58) Field of Search ................................ 438/612, 613, 438/614, 700, 702, 717, 736

(56) References Cited

U.S. PATENT DOCUMENTS

| | | | |
|---|---|---|---|
| 5,496,770 A | * 3/1996 | Park | ............................. 216/47 |
| 5,633,535 A | 5/1997 | Chao et al. | ................... 257/778 |
| 5,665,639 A | 9/1997 | Seppala et al. | ................ 438/15 |
| 5,882,957 A | 3/1999 | Lin | .............................. 438/126 |
| 5,904,156 A | 5/1999 | Advocate, Jr. et al. | .......... 134/2 |
| 6,051,450 A | 4/2000 | Ohsawa et al. | .............. 438/123 |
| 6,218,281 B1 | * 4/2001 | Watanabe et al. | ............ 438/612 |
| 2001/0028105 A1 | * 10/2001 | Hashimoto et al. | .......... 257/686 |

FOREIGN PATENT DOCUMENTS

| | | | | |
|---|---|---|---|---|
| JP | 63318145 A | * | 12/1988 | ............ H01L/21/92 |
| JP | 02087526 A | * | 3/1990 | .......... H01L/21/321 |
| JP | 03019344 A | * | 1/1991 | .......... H01L/21/321 |

* cited by examiner

*Primary Examiner*—George Eckert
*Assistant Examiner*—N. Drew Richards
(74) *Attorney, Agent, or Firm*—George O. Saile; Stephen B. Ackerman; Stephen G. Stanton

(57) ABSTRACT

A method of forming a bump structure, comprising the following steps. A structure having an exposed first conductive structure is provided. A first photoresist layer is formed over the structure and the exposed first conductive structure. A second capping photoresist layer is formed over the first photoresist layer. The first and second photoresist layers being comprised of different photoresist materials. The first and second photoresist layers are patterned to form an opening through the first and second photoresist layers and over the first conductive structure. The second capping photoresist layer prevents excessive formation of first photoresist layer residue during processing. A second conductive structure is formed within the opening. The first and second patterned photoresist layers are stripped. The second conductive structure is reflowed to form the bump structure.

25 Claims, 2 Drawing Sheets

DUAL LAYER PHOTORESIST METHOD FOR FABRICATING A MUSHROOM BUMPING PLATING STRUCTURE

FIELD OF THE INVENTION

The present invention relates generally to semiconductor fabrication and more specifically to bump processing for semiconductor device fabrication.

BACKGROUND OF THE INVENTION

To electrically communicate between semiconductor device circuitry mounted on a chip carrier and from outside the chip, bonding pads that electrically communicate with the semiconductor device circuitry are exposed through a passivation layer over a wafer. "Bumps" may then be formed over the bonding pads with wires, for example, attached to the bumps that permit electrical communication between the semiconductor device circuitry and outside the chip.

Mushroom structure plating is used to obtain the desired final bump height without any change from a design point, i.e. without forming wider openings exposing the under bump metal (UBM) upon which the bump is deposited.

U.S. Pat. No. 5,665,639 to Seppala et al. describes a process for manufacturing a bump electrode using a rapid thermal anneal (RTA) that minimizes the intermixing of materials between a bump and a bonding pad.

U.S. Pat. No. 6,051,450 to Ohsawa et al. describes a method of manufacturing a lead frame whereby metal films to constitute bumps are formed on a metal base by electrolytic plating and then a circuit wiring including inner leads is formed by electrolytic plating with a metal so that the inner leads are connected to the respective metal films.

U.S. Pat. No. 5,904,156 to Advocate, Jr. et al. describes a process for wet chemically stripping dry, thick film photoresists in semiconductor applications.

U.S. Pat. No. 5,882,957 to Lin describes a ball grid array (BGA) packaging method for an integrated circuit (IC).

U.S. Pat. No. 5,633,535 to Chao et al. describes an apparatus having standoff spacing pedestals supporting a device above a substrate during solder reflow and bonding.

SUMMARY OF THE INVENTION

Accordingly, it is an object of the present invention to provide an improved method of forming mushroom bumping plating structures.

Other objects will appear hereinafter.

It has now been discovered that the above and other objects of the present invention may be accomplished in the following manner. Specifically, a structure having an exposed first conductive structure is provided. A first photoresist layer is formed over the structure and the exposed first conductive structure. A second capping photoresist layer is formed over the first photoresist layer. The first and second photoresist layers being comprised of different photoresist materials. The first and second photoresist layers are patterned to form an opening through the first and second photoresist layers and over the first conductive structure. The second capping photoresist layer prevents excessive formation of first photoresist layer residue during processing. A second conductive structure is formed within the opening. The first and second patterned photoresist layers are stripped. The second conductive structure is reflowed to form the bump structure.

BRIEF DESCRIPTION OF THE DRAWINGS

The present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Unless otherwise specified, all structures, layers, steps, methods, etc. may be formed or accomplished by conventional steps or methods known in the prior art.

Problems Discovered by the Inventors

The inventors have discovered the following problems and disadvantages with the current practice:

1. Bump height is a key requirement to obtain improved reliability but the under bump metal (UBM) size is limited for reliability concerns if increased bump height is attempted through the use of increasing the UBM size. Mushroom structure plating is the best avenue to obtain sufficient bump height without any change from the design point of view.
2. Liquid photoresist (PR) coatings are limited to a thickness of about 80 μm. Mushroom bridge is a concern if final pitch bump is required. That is, larger and wider mushroom shaped bumps are needed which markedly decreases the clearance between adjacent mushroom bumps thus making bridges between the mushrooms easier to form.
3. Dry film resist (DFR) will leave DFR residue is a mushroom plating is applied.
4. Edge electrode contact is necessary for the electroplating process. If a negative type DFR is used, it is not easy to rinse away from the wafer edge so electrode contact becomes a problem.

Brief Summary of the Invention

The following is a brief summary of the steps of the invention:

1. under bump metal (UBM) sputter;
2. dry film resist (DFR) lamination;
3. PET film removal from the DRF;
4. Negative liquid photoresist (PR) spin-on; Key Step of the Invention;
5. Edge rinse;
6. Exposure of liquid PR and DFR;
7. Develop liquid PR and DFR;
8. Electroplating mushroom shaped solder;
9. Liquid PR and DFR stripping;
10. UBM etch; and
11. Reflow of mushroom shaped solder to form the mushroom bumping plating structure.

Initial Structure

Figure 1:
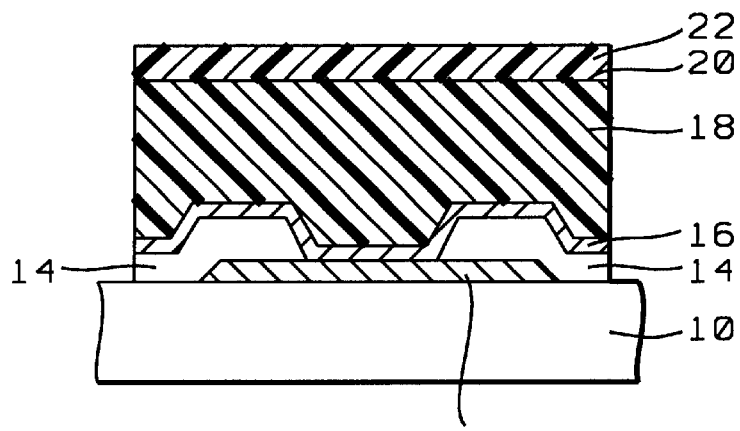
FIGS. 1 to 6 schematically illustrate a preferred embodiment of the present invention.

As shown in FIG. 1, starting structure 10 includes at least one exposed conductive bonding pad 12 preferably through passivation layer 14. Structure 10 is preferably a semiconductor structure and is also understood to possibly include a semiconductor wafer or substrate, active and passive devices formed within the wafer, conductive layers and dielectric layers (e.g., inter-poly oxide (IPO), intermetal dielectric (IMD), etc.) formed over the wafer surface. The term "semiconductor structure" is meant to include devices formed within a semiconductor wafer and the layers overlying the wafer.

Bonding pad 12 is preferably comprised of copper or aluminum. Passivation layer 14 is preferably comprised of $Si_3N_4$, $SiO_2$, $Si_3N_4/SiO_2$, polyimide or BCB and is more preferably comprised of $Si_3N_4/SiO_2$.

Under bump metal (UBM) layer 16 is formed over passivation layer 14 and the exposed portion of bonding pad 12. UBM layer 16 is preferably from about 1000 to 6000 Å thick. UBM layer 16 is preferably comprised of Ti/Cu, Cr/Cu, Ti/Ni or Ni/Au.

Dry film resist (DFR) 18 is laminated over the structure and UBM layer 16 with the polyester layer (not shown) removed from DFR 18 during lamination. The PET film (not shown), an organic tape used to protect the underlying DFR, is removed from the upper surface 20 of DFR 18. DFR is preferably from about 100 to 120 microns thick and is more preferably from about 105 to 115 microns thick and is most preferably about 110 microns thick.

Key Step of the Invention

In a key step of the invention, negative liquid photoresist (PR) layer 22 is formed over DFR 18 to a thickness of preferably from about 1.5 to 5.5 microns and more preferably from about 2 to 5 microns. Liquid PR 22 is preferably a negative liquid PR that is spun-on DFR 18.

An edge rinse is then performed to remove any residue from the edge area of structure 10.

Exposure and Developing of Liquid PR Layer 22 and DFR 18

Figure 2:
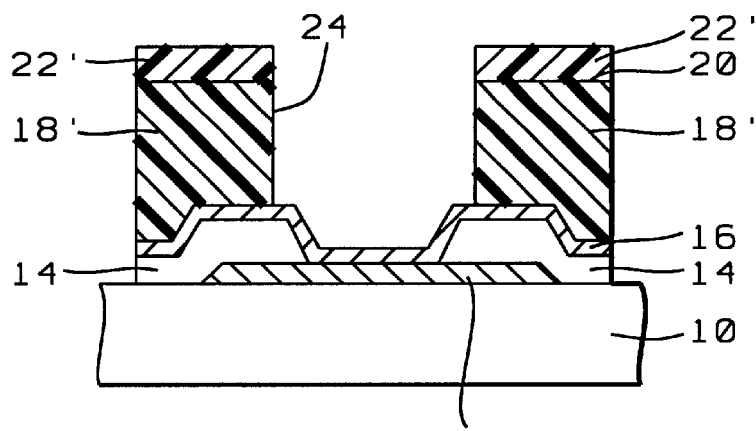

As shown in FIG. 2, liquid PR layer 22 and DFR 18 are exposed and developed to form opening 24 through patterned liquid PR layer 22' and patterned DFR 18' exposing UBM layer 16 over bonding pad 12. Opening 24 is preferably from about 150 to 500 Å wide.

Electroplating Mushroom Shaped Solder 26

Figure 3:
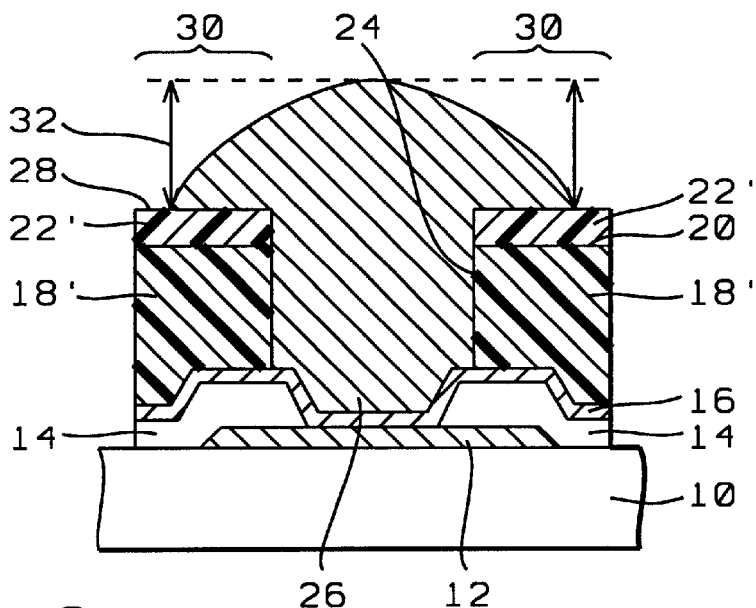

As shown in FIG. 3, solder is deposited within opening 24, filling opening 24 and over the upper surface 28 within region 30 of liquid PR layer 22' adjacent opening 24. Solder is preferably electroplated within opening 24 and preferably forms mushroom shaped structure 26, for example.

Mushroom shaped solder structure 26 is preferably a solder alloy comprised of SnAg, PbSn, SnAgCu, SnBi, or SnTn and is more preferably formed of PbSn.

Mushroom shaped structure 26 extends at 32 above upper surface 28 of liquid PR layer 22' depending upon what bump height 32 is required which also determines how far mushroom shaped structure 26 extends over region 30.

Stripping Negative Liquid PR Layer 22' and DFR 18'

Figure 4:
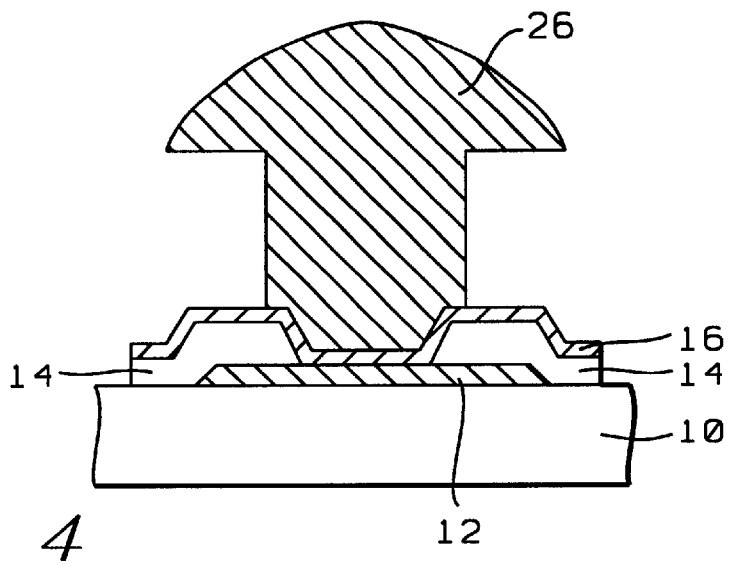

As shown in FIG. 4, negative liquid PR layer 22' and DFR 18' are stripped from the structure leaving mushroom shaped structure 26 standing over UBM layer 16. The same stripping process may be used to strip both negative liquid PR layer 22' and DFR 18'.

As negative liquid PR layer 22' is stripped from the structure the stripper may then flow into the gap created by the removal of the negative liquid PR layer 22' along the vertical sides of the mushroom shaped structure 26 between the mushroom shaped structure 26 and DFR 18'. The makes is easier to peel DFR 18' from the wafer surface.

UBM Layer 16 Etching

Figure 5:
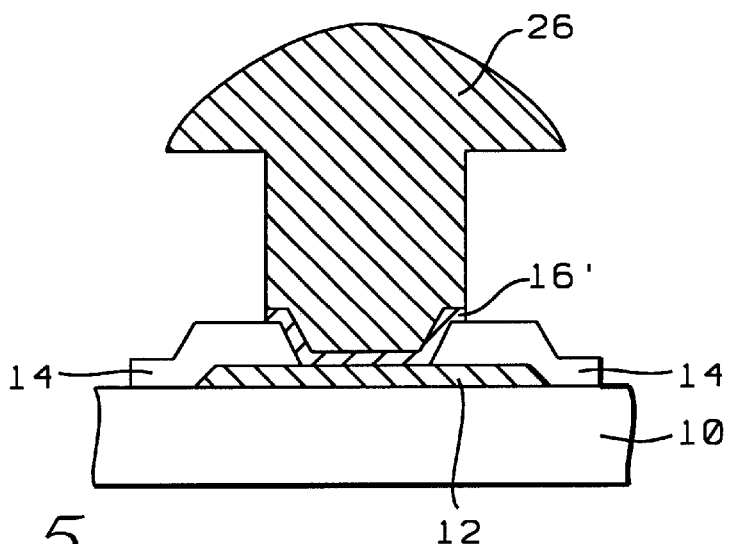

As shown in FIG. 5, an isotropic etch is used to etch UBM layer 16 not under the base of mushroom shaped structure 26 to form etched UBM layer 16'. Preferably the isotropic etch is a wet etch process.

Reflow of Mushroom Shaped Solder Structure 26

Figure 6:
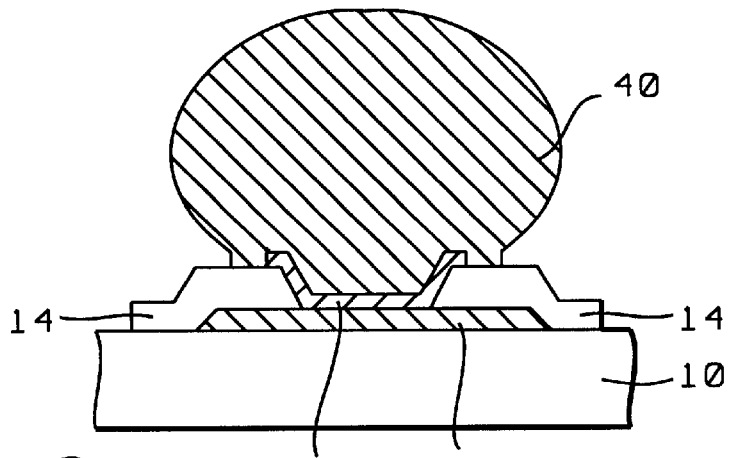

As shown in FIG. 6, mushroom shaped solder structure 26 is subjected to a reflow process to reflow the mushroom structure 26 to form solder ball/bump 40.

The reflow process has a temperature of preferably from about 230 to 250° C., more preferably from about 235 to 245° C. and most preferably about 240° C. If mushroom shaped solder structure 26 is comprised of a high lead (Pb) solder then the reflow process has a temperature of preferably from about 350 to 370° C., more preferably from about 355 to 365° C. and most preferably about 360° C.

Advantages of the Present Invention

The advantages of the present invention include:
1. sufficient bump height is achieved to improve reliability;
2. DFR residue is eliminated by capping the liquid PR;
3. edge electrode contact for electroplating is easily achieved without DFR residue; and
4. the process window for fine pitch bump application is increased.

While particular embodiments of the present invention have been illustrated and described, it is not intended to limit the invention, except as defined by the following claims.

We claim:
1. A method of forming a bump structure, comprising the steps of:
   providing a structure having an exposed first conductive structure; the first conductive structure being a bonding pad;
   forming a first photoresist layer over the structure and the exposed first conductive structure; the first photoresist layer being a dry resist film (DFR);
   forming a second capping photoresist layer over the first photoresist layer; the first photoresist layer being unexposed; the second capping photoresist layer being a liquid photoresist;
   patterning the first and second photoresist layers to form an opening through the first and second photoresist layers and, over the first conductive structure wherein the second capping photoresist layer prevents excessive formation of first photoresist layer residue during processing;
   forming a second conductive structure within the opening;
   stripping the first and second patterned photoresist layers; and
   reflowing the second conductive structure to form the bump structure.
2. The method of claim 1, including the steps of:
   forming an under bump metal (UBM) layer over, and in electrical communication with, at least a portion of the exposed first conductive structure before formation of the first photoresist layer; and etching a portion of the UBM layer not under the second conductive structure before the reflow of the second conductive structure to form the bump structure.

3. The method of claim 1, wherein the second conductive structure is mushroom shaped.

4. The method of claim 1, wherein the first conductive structure is comprised of a material selected from the group consisting of copper and aluminum; the second capping photoresist layer is negative liquid photoresist; and the second conductive structure is comprised of a alloy solder material selected from the group consisting of SnAg, PbSn, SnAgCu, SnBi and SnTn.

5. The method of claim 1, wherein the structure is a semiconductor structure.

6. The method of claim 1, wherein the structure includes an overlying passivation layer through which the first conductive structure is exposed.

7. The method of claim 1, wherein the first photoresist layer is from about 100 to 120 microns thick, the second capping photoresist layer is from about 1.5 to 5.5 microns thick, and the opening is from about 150 to 500 Å wide.

8. The method of claim 1, wherein the first photoresist layer is from about 105 to 115 microns thick, the second capping photoresist layer is from about 2 to 5 microns thick, and the opening is from about 150 to 500 Å wide.

9. The method of claim 1, including the steps of:
forming an under bump metal (UBM) layer over, and in electrical communication with, at least a portion of the exposed first conductive structure before formation of the first photoresist layer; the UBM layer having a thickness of from about 1000 to 6000 Å; and
etching a portion of the UBM layer not under the second conductive structure before the reflow of the second conductive structure to form the bump structure.

10. The method of claim 1, including the steps of:
forming an under bump metal (UBM) layer over, and in electrical communication with, at least a portion of the exposed first conductive structure before formation of the first photoresist layer; the UBM layer being formed of a material selected from the group consisting of Ti/Cu, Cr/Cu, Ti/Ni and Ni/Au; and
etching a portion of the UBM layer not under the second conductive structure before the reflow of the second conductive structure to form the bump structure.

11. A method of forming a bump structure, comprising the steps of:
providing a structure having an exposed first conductive structure; the first conductive structure being a bonding pad;
forming an under bump metal (UBM) layer over, and in electrical communication with, at least a portion of the exposed first conductive structure;
forming a first photoresist layer over the UBM layer; the first photoresist layer being dry resist film (DFR);
forming a second capping photoresist layer over the first photoresist layer; the first photoresist layer being unexposed; the second capping photoresist layer being liquid photoresist;
patterning the first and second photoresist layers to form an opening through the first and second photoresist layers and exposing at least a portion of the UBM layer over the first conductive structure; wherein the second capping photoresist layer prevents excessive formation of first photoresist layer residue during processing;
forming a second conductive structure within the opening and in electrical communication with the UBM layer;
stripping the first and second patterned photoresist layers;
etching a portion of the UBM layer not under the second conductive structure; and
reflowing the second conductive structure to form the bump structure.

12. The method of claim 11, wherein the second conductive structure is mushroom shaped.

13. The method of claim 11, wherein the first conductive structure is comprised of a material selected from the group consisting of copper and aluminum; the UBM layer is comprised of a material selected from the group consisting of Ti/Cu, Cr/Cu, Ti/Ni and Ni/Au; the second capping photoresist layer is negative liquid photoresist; and the second conductive structure is comprised of a alloy solder material selected from the group consisting of SnAg, PbSn, SnAgCu, SnBi and SnTn.

14. The method of claim 11, wherein the structure is a semiconductor structure.

15. The method of claim 11, wherein the structure includes an overlying passivation layer through which the first conductive structure is exposed.

16. The method of claim 11, wherein the UBM layer is from about 1000 to 6000 Å thick; the first photoresist layer is from about 100 to 120 microns thick, the second capping photoresist layer is from about 1.5 to 5.5 microns thick, and the opening is from about 150 to 500 Å wide.

17. The method of claim 11, wherein the UBM layer is from about 1000 to 6000 Å thick; wherein the first photoresist layer is from about 105 to 115 microns thick, the second capping photoresist layer is from about 2 to 5 microns thick, and the opening is from about 150 to 500 Å wide.

18. A method of forming a bump structure, comprising the steps of:
providing a structure having a conductive structure exposed through a passivation layer;
forming an under bump metal (UBM) layer over the passivation layer and over, and in electrical communication with, at least a portion of the exposed conductive structure;
forming a DFR layer over the UBM layer;
forming a spin-on liquid photoresist layer over the DFR layer; the DFR layer being unexposed;
patterning the liquid photoresist layer and the DFR layer to form an opening through the liquid photoresist layer and the DFR layer and exposing at least a portion of the UBM layer over the conductive structure; wherein the liquid photoresist layer prevents excessive formation of DFR layer residue during processing;
forming a mushroom shaped conductive structure within the opening and in electrical communication with the UBM layer;
stripping the liquid photoresist layer and the DFR layer;
etching a portion of the UBM layer not under the mushroom shaped conductive structure; and
reflowing the mushroom shaped conductive structure to form a bump structure.

19. The method of claim 18, wherein the conductive structure is a bonding pad.

20. The method of claim 18, wherein the passivation layer is comprised of a material selected from the group consisting of $Si_3N_4$, $SiO_2$, $Si_3N_4/SiO_2$, polyimide and BCB; the conductive structure is comprised of a material selected from the group consisting of copper and aluminum; the UBM layer is comprised of a material selected from the group consisting of Ti/Cu, Cr/Cu, Ti/Ni and Ni/Au; and the mushroom shaped conductive structure is comprised of a alloy solder material selected from the group consisting of SnAg, PbSn, SnAgCu, SnBi, and SnTn.

21. The method of claim 18, wherein the structure is a semiconductor structure.

22. The method of claim 18, wherein the UBM layer is from about 1000 to 6000 Å thick; the first photoresist layer is from about 100 to 120 microns thick, the second capping photoresist layer is from about 1.5 to 5.5 microns thick, and the opening is from about 100 to 500 Å wide.

23. The method of claim 18, wherein the UBM layer is from about 1000 to 6000 Å thick; the DFR layer is from about 105 to 115 microns thick, the liquid photoresist layer is from about 2 to 5 microns thick, and the opening is from about 150 to 500 Å wide.

24. The method of claim 18, wherein the passivation layer is comprised of a material selected from the group consisting of $Si_3N_4$, $SiO_2$, $Si_3N_4/SiO_2$, polyimide and BCB; the conductive structure is comprised of a material selected from the group consisting of copper and aluminum; the UBM layer is from about 1000 to 6000 Å and is comprised of a material selected from the group consisting of Ti/Cu, Cr/Cu, Ti/Ni and Ni/Au; and the mushroom shaped conductive structure is comprised of a alloy solder material selected from the group consisting of SnAg, PbSn, SnAgCu, SnBi, and SnTn.

25. The method of claim 18, wherein the passivation layer is comprised of a material selected from the group consisting of $Si_3N_4$, $SiO_2$, $Si_3N_4/SiO_2$, polyimide and BCB; the conductive structure is comprised of a material selected from the group consisting of copper and aluminum; the UBM layer is from about 1000 to 6000 Å and is comprised of a material selected from the group consisting of Ti/Cu, Cr/Cu, Ti/Ni and Ni/Au; the mushroom shaped conductive structure is comprised of a alloy solder material selected from the group consisting of SnAg, PbSn, SnAgCu, SnBi, and SnTn; the UBM layer is from about 1000 to 6000 Å thick; the DFR layer is from about 105 to 115 microns thick, the liquid photoresist layer is from about 2 to 5 microns thick, and the opening is from about 150 to 500 Å wide.

\* \* \* \* \*